(12) United States Patent
Kim et al.

(10) Patent No.: US 9,467,161 B1
(45) Date of Patent: Oct. 11, 2016

(54) LOW-POWER, HIGH-SPEED SUCCESSIVE APPROXIMATION REGISTER ANALOG-TO-DIGITAL CONVERTER AND CONVERSION METHOD USING THE SAME

(71) Applicant: Korea University Research and Business Foundation, Seoul (KR)

(72) Inventors: Chul Woo Kim, Seoul (KR); Se Jin Park, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/007,368

(22) Filed: Jan. 27, 2016

(30) Foreign Application Priority Data

May 7, 2015 (KR) .......................... 10-2015-0063727

(51) Int. Cl.
*H03M 1/38* (2006.01)
*H03M 1/46* (2006.01)

(52) U.S. Cl.
CPC ............... *H03M 1/38* (2013.01); *H03M 1/466* (2013.01)

(58) Field of Classification Search
CPC .............................. H03M 1/38; H03M 1/466
USPC ......................... 341/155, 163, 156
See application file for complete search history.

(56) References Cited

U.S. PATENT DOCUMENTS

| 2005/0270208 | A1* | 12/2005 | Kwon ................. H03M 1/1061 341/144 |
| 2007/0115159 | A1 | 5/2007 | Tachibana et al. |
| 2012/0025062 | A1* | 2/2012 | Neubauer ............ H03M 1/145 250/208.1 |
| 2012/0026027 | A1* | 2/2012 | Steensgaard-Madsen H03M 1/466 341/161 |
| 2014/0008515 | A1* | 1/2014 | Wang .................... H03M 1/145 250/208.1 |

OTHER PUBLICATIONS

Huang et al., "A 1-μW 10-bit 200-kS/s SAR ADC with a Bypass Window for Biomedical Applications," IEEE Journal of Solid-State Circuits (Nov. 2012); 47(11)2783-2795.

* cited by examiner

*Primary Examiner* — Peguy Jean Pierre
(74) *Attorney, Agent, or Firm* — Fox Rothschild LLP; Peter J. Butch, III; Carol E. Thorstad-Forsyth

(57) ABSTRACT

Provided is a low-power, high-speed successive approximation register (SAR) analog-to-digital converter (ADC). The low-power, high-speed SAR ADC includes a bootstrapping unit configured to receive inputs of first and second analog signals, a double-bit output SAR analog-to-digital conversion unit configured to output a two-bit digital signal for each clock cycle section with respect to the first and second analog signals applied through the bootstrapping unit, and a single-bit output SAR analog-to-digital conversion unit configured to output a one-bit digital signal for each clock cycle section with respect to the first and second analog signals applied through the bootstrapping unit.

15 Claims, 4 Drawing Sheets

LOW-POWER, HIGH-SPEED SUCCESSIVE APPROXIMATION REGISTER ANALOG-TO-DIGITAL CONVERTER AND CONVERSION METHOD USING THE SAME

CROSS-REFERENCE TO RELATED APPLICATION

This application claims priority to and the benefit of Korean Patent Application No. 10-2015-0063727, filed on May 7, 2015, the disclosure of which is incorporated herein by reference in its entirety.

BACKGROUND

1. Field of the Invention

The present disclosure relates to a low-power, high-speed successive approximation register (SAR) analog-to-digital converter (ADC) and a conversion method using the same. More particularly, the present disclosure relates to a low-power, high-speed SAR ADC and a conversion method using the same capable of improving a sampling speed.

2. Discussion of Related Art

In data processing, digital signal processing having a high processing speed and insensitive to environment noise is more advantageous than analog signal processing. However, because many signals in the nature have an analog form, it is necessary to convert an analog signal input in an integrated circuit into a digital signal.

ADCs may be roughly classified into a pipeline ADC, an SAR ADC, a flash ADC, and a delta-sigma ADC. According to a sampling speed and resolution, there is a suitable structure.

Among the ADCs, the SAR ADC advantageously has a simpler circuit structure than ADCs of different structures and is operable at low power, but has a disadvantage of a low operation speed. However, the operation speed is improved by applying time interleaved technology. Accordingly, because the SAR ADC using the time interleaved technology is more advantageous than other existing structures in terms of low power and has a high-speed operation, the SAR ADC is known as an optimized structure in terms of power consumption and an operation speed.

However, because this SAR ADC converts an analog signal into a digital signal through comparison and approximation processes in many steps, a sum of a clock cycle time for a number of comparison-approximation processes and a time of one clock cycle for sampling an analog signal is required. For example, in the case of the SAR ADC having the resolution of N bits, a time taken to convert all data is a total time of (N+1) clock cycles obtained by adding a time of N clock cycles for N comparisons and a time of one clock cycle for the above-described sampling. That is, a sampling speed of the conventional SAR ADC is limited due to a limit of an internal clock speed as described above.

On the other hand, an detect and skip (DAS) algorithm using coarse and fine DACs has been proposed to reduce switching power of a capacitor type DAC, but the DAS algorithm has a sampling speed of about 10 KS/s and is not suitable for the high-speed SAR ADC.

SUMMARY OF THE INVENTION

The present disclosure is directed to provide a low-power, high-speed SAR ADC and a conversion method using the same capable of improving a sampling speed by combining an SAR ADC configured to output a single bit and an SAR ADC configured to output two bits.

Also, the present disclosure is directed to provide a low-power, high-speed SAR ADC and a conversion method using the same capable of improving a sampling speed by applying a top plate sampling technique.

Also, the present disclosure is directed to provide a low-power, high-speed SAR ADC and a conversion method using the same capable of improving a sampling speed by applying comparator threshold voltage modulation technology.

In the present disclosure, there is provided a low-power, high-speed successive approximation register (SAR) analog-to-digital converter (ADC) including: a bootstrapping unit configured to receive inputs of first and second analog signals; a double-bit output SAR analog-to-digital conversion unit configured to output a two-bit digital signal for each clock cycle section with respect to the first and second analog signals applied through the bootstrapping unit; and a single-bit output SAR analog-to-digital conversion unit configured to output a one-bit digital signal for each clock cycle section with respect to the first and second analog signals applied through the bootstrapping unit.

The bootstrapping unit may include first to third bootstrapping switch pairs. The first and second bootstrapping switch pairs may apply the first and second analog signals to the double-bit output SAR analog-to-digital conversion unit. Third bootstrapping switch pair may apply the first and second analog signals to the single-bit output SAR analog-to-digital conversion unit.

The first and second analog signals may be differential signals.

The double-bit output SAR analog-to-digital conversion unit may include: first and second capacitor digital-to-analog converters (DACs) implemented by a capacitor array of a differential structure including a plurality of capacitors and configured to output a voltage of a positive capacitor array and a voltage of a negative capacitor array; a first comparator configured to compare the voltage of the positive capacitor array and the voltage of the negative capacitor array of the first capacitor DAC; a second comparator configured to compare the voltage of the positive capacitor array of the first capacitor DAC with the voltage of the negative capacitor array of the second capacitor DAC; a third comparator configured to compare the voltage of the positive capacitor array and the voltage of the negative capacitor array of the second capacitor DAC; and a first SAR logic configured to generate a digital code for an input voltage based on comparison results of the first to third comparators and control operations of the first and second capacitor DACs.

The first to third comparators may perform threshold voltage modulation.

The single-bit output SAR analog-to-digital conversion unit may include: a third capacitor DAC implemented by a capacitor array of a differential structure including a plurality of capacitors and configured to output a voltage of a positive capacitor array and a voltage of a negative capacitor array; a fourth comparator configured to compare the voltage of the positive capacitor array and the voltage of the negative capacitor array of the third capacitor DAC; and a second SAR logic configured to generate a digital code for an input voltage based on a comparison result of the fourth comparator and control an operation of the third capacitor DAC.

The third capacitor DAC may have top plates of capacitors constituting the capacitor array to which the first and second analog signals applied through the bootstrapping unit are directly applied and bottom plates of the capacitors to which a reference voltage is applied and perform top plate sampling.

The second SAR logic may output a most significant bit (MSB) from a signal sampled by the top plate sampling through the fourth comparator.

The double-bit output SAR analog-to-digital conversion unit may start an operation in response to an MSB output signal of the sampled signal.

The second SAR logic may settle the third capacitor DAC based on output data of the double-bit output SAR analog-to-digital conversion unit and output the remaining bits except an MSB and bits output by the double-bit SAR analog-to-digital conversion unit through the fourth comparator.

The third capacitor DAC may determine capacitance of a unit capacitor based on noise performance of the third capacitor DAC.

In the present disclosure, there is provided an analog-to-digital conversion method using a low-power, high-speed SAR ADC in which an SAR ADC configured to output a single bit and an SAR ADC configured to output two bits are combined. The analog-to-digital conversion method includes: performing top plate sampling in response to inputs of first and second analog signals; outputting an MSB of a top-plate-sampled signal; performing double-bit output SAR analog-to-digital conversion for outputting a two-bit digital signal for each clock cycle section with respect to the first and second analog signals when the MSB of the top-plate-sampled signal is output; and performing single-bit output SAR analog-to-digital conversion for outputting a one-bit digital signal for each clock cycle section with respect to the first and second analog signals when a result of the double-bit output SAR analog-to-digital conversion is output.

The outputting of the MSB of the top-plate-sampled signal may be performed by the SAR ADC configured to output the single bit.

The single-bit output SAR analog-to-digital conversion may include: settling a capacitor DAC for the single-bit output SAR analog-to-digital conversion based on data output in the double-bit output SAR analog-to-digital conversion; and outputting the remaining bits except the MSB output in the outputting of the MSB and bits output in the double-bit output SAR analog-to-digital conversion.

A sampling speed of a low-power, high-speed SAR ADC may be improved by combining an SAR ADC configured to output a single bit and an SAR ADC configured to output two bits, applying a top plate sampling technique, and applying comparator threshold voltage modulation technology. Also, there is an advantage in that the number of interleaving channels may be reduced by improving the speed of a single channel SAR ADC for use in a time-interleaved method and a probability of occurrence of time mismatch may be reduced.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings.

DETAILED DESCRIPTION

Figure 1:
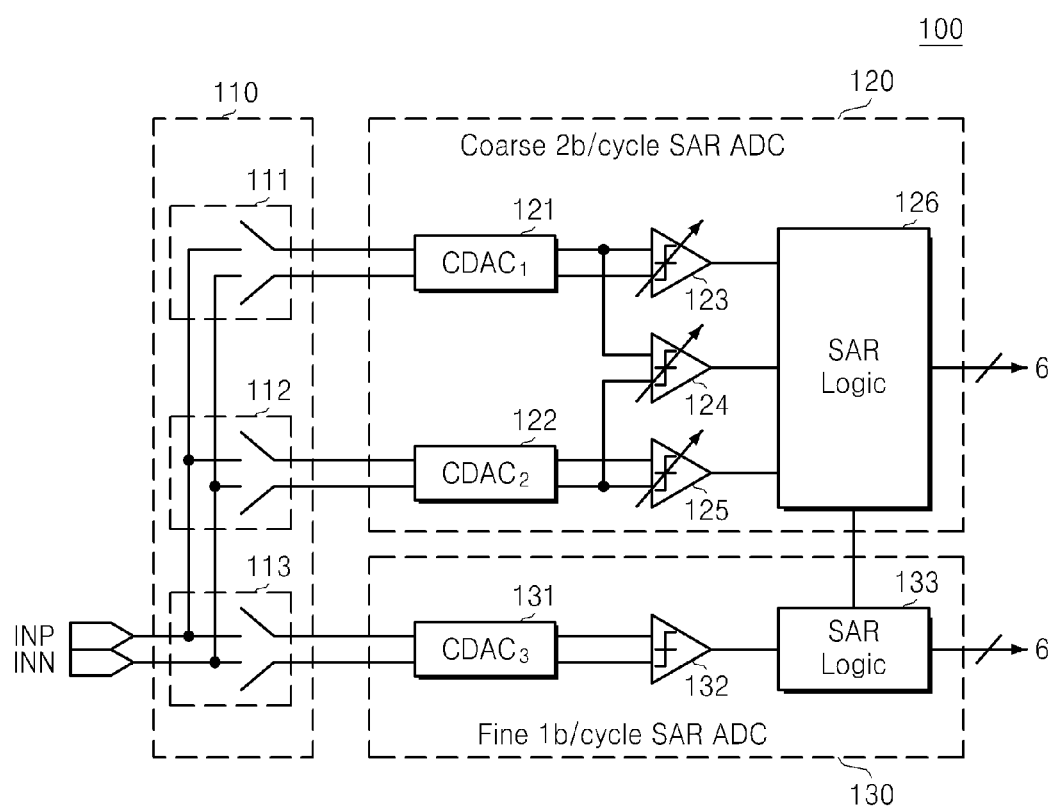
FIG. 1 is a schematic block diagram illustrating a low-power, high-speed SAR ADC.

Hereinafter, exemplary embodiments of the present invention will be described in detail with reference to the accompanying drawings in order for those skilled in the art to be able to readily implement the invention. It is to be noted the present invention is not limited to the following embodiments and may be embodied in various forms. Furthermore, parts not related to the present invention are omitted in order to clarify the present invention in the drawings, and the same or similar reference numerals are used to denote the same or similar functions throughout the drawings.

Throughout this specification and the claims, when a certain part includes a certain component, it means that another component may be further included not excluding other components unless otherwise defined.

FIG. 1 is a schematic block diagram illustrating a low-power, high-speed SAR ADC. Referring to FIG. 1, the low-power, high-speed SAR ADC 100 includes a bootstrapping unit 110, a double-bit output SAR analog-to-digital conversion unit (coarse 2b/cycle SAR ADC) 120, and a single-bit output SAR analog-to-digital conversion unit (fine 1b/cycle SAR ADC) 130.

The bootstrapping unit 110 receives an input of an externally applied analog signal. That is, as illustrated in FIG. 1, the bootstrapping unit 110 receives inputs of first and second analog signals INP and INN and transfers the first and second analog signals INP and INN to the next stage. For this, the bootstrapping unit 110 includes three bootstrapping switch pairs 111, 112, and 113 which transfer the input first and second analog signals INP and INN to capacitor DACs (CDACs) $CDAC_1$, $CDAC_2$, and $CDAC_3$ 121, 122, and 131 connected one-to-one to the next stage. At this time, the first and second analog signals INP and INN are differential signals.

The double-bit output SAR analog-to-digital conversion unit (coarse 2b/cycle SAR ADC) 120 outputs a digital signal for the first and second analog signals INP and INN applied through two bootstrapping switch pairs 111 and 112. In this case, a two-bit digital signal is output for each clock cycle section. For this, the double-bit output SAR analog-to-digital conversion unit (coarse 2b/cycle SAR ADC) 120 includes first and second CDACs $CDAC_1$ and $CDAC_2$ 121 and 122, three comparators (first to third comparators) 123, 124, and 125 capable of performing threshold voltage modulation, and an SAR logic 126.

The first and second CDACs $CDAC_1$ and $CDAC_2$ 121 and 122 sample the first and second analog signals INP and INN transferred from the two bootstrapping switch pairs 111 and 112 and output the sampled analog signals to the first to third comparators 123, 124, and 125. For this, each of the first and second CDACs $CDAC_1$ and $CDAC_2$ 121 and 122 is implemented by a capacitor array of a differential structure including a plurality of capacitors and outputs a voltage of a positive capacitor array and a voltage of a negative capacitor array. At this time, the first and second CDACs $CDAC_1$ and $CDAC_2$ 121 and 122 may perform top plate sampling on the first and second analog signals INP and INN. For this, the first and second analog signals INP and INN are directly applied to the top plates of the capacitors constituting the capacitor array and a common mode voltage is applied to bottom plates thereof. If the first and second CDACs $CDAC_1$ and $CDAC_2$ 121 and 122 are in a comparison and settling section rather than a sampling section, a positive or negative reference voltage is connected to the bottom plate.

Also, the CDAC generally corresponds one-to-one to the comparator, but one DAC (CDAC) may be reduced using interpolation technology in the CDAC. Accordingly, the first and second CDACs $CDAC_1$ and $CDAC_2$ 121 and 122 and comparators (first to third comparators 123, 124, and 125) of a subsequent stage are connected as illustrated in the drawing. That is, the first comparator 123 compares a voltage of a positive capacitor array and a voltage of a negative capacitor array of the first CDAC $CDAC_1$. The second comparator 124 compares the voltage of the positive capacitor array of the first CDAC $CDAC_1$ with the voltage of the negative capacitor array of the second CDAC $CDAC_2$. On the other hand, the third comparator 125 compares a positive capacitor array voltage and the voltage of the negative capacitor array of the second CDAC $CDAC_2$.

For this, the first to third comparators 123 to 125 may modulate a threshold voltage. The threshold voltage may be modulated in consideration of a low-power design. At this time, because performance superiority among the first to third comparators 123 to 125 is not significantly important, the first to third comparators 123 to 125 may be designed in order to reduce power consumption of the total system.

The SAR logic 126 generates a digital code for the input voltage based on comparison results of the first to third comparators 123 to 125 based on comparison results of the first to third comparators 123 to 125 and controls operations of the first and second CDACs $CDAC_1$ and $CDAC_2$ 121 and 122.

For example, when the low-power, high-speed SAR ADC has the resolution of 12 bits, the double-bit output SAR analog-to-digital conversion unit (coarse 2b/cycle SAR ADC) 120 outputs a 6-bit signal. Six bits except the MSB, that is, six more significant bits from the more significant bit next to the MSB, are output.

On the other hand, the single-bit output SAR analog-to-digital conversion unit (fine 1b/cycle SAR ADC) 130 outputs a digital signal for the first and second analog signals INP and INN applied through the bootstrapping switch pair 113. At this time, a one-bit digital signal is output for each clock cycle section. When the low-power, high-speed SAR ADC has the resolution of 12 bits as in the above-described example, the single-bit output SAR analog-to-digital conversion unit (fine 1b/cycle SAR ADC) 130 outputs a signal of six bits including the MSB and five less significant bits. In other words, the single-bit output SAR analog-to-digital conversion unit (fine 1b/cycle SAR ADC) 130 first generates the MSB by performing the top plate sampling on the first and second analog signals applied through the bootstrapping switch pair 113. When six bits except for the MSB is transferred from the double-bit output SAR analog-to-digital conversion unit (coarse 2b/cycle SAR ADC) 120 after the generated MSB is transferred to the double-bit output SAR analog-to-digital conversion unit (coarse 2b/cycle SAR ADC) 120, the remaining five bits (except for the seven more significant bits) are output.

For this, the single-bit output SAR analog-to-digital conversion unit (fine 1b/cycle SAR ADC) 130 includes a third CDAC $CDAC_3$ 131, a comparator 132, and an SAR logic 133.

The third CDAC $CDAC_3$ 131 is implemented by a capacitor array of a differential structure including a plurality of capacitors and outputs a voltage of a positive capacitor array and a voltage of a negative capacitor array. In particular, the third CDAC $CDAC_3$ 131 performs top plate sampling on the first and second analog signals INP and INN applied through the bootstrapping switch pair 113. For this, the third CDAC $CDAC_3$ 131 may be implemented as illustrated in FIG. 2.

Figure 2:
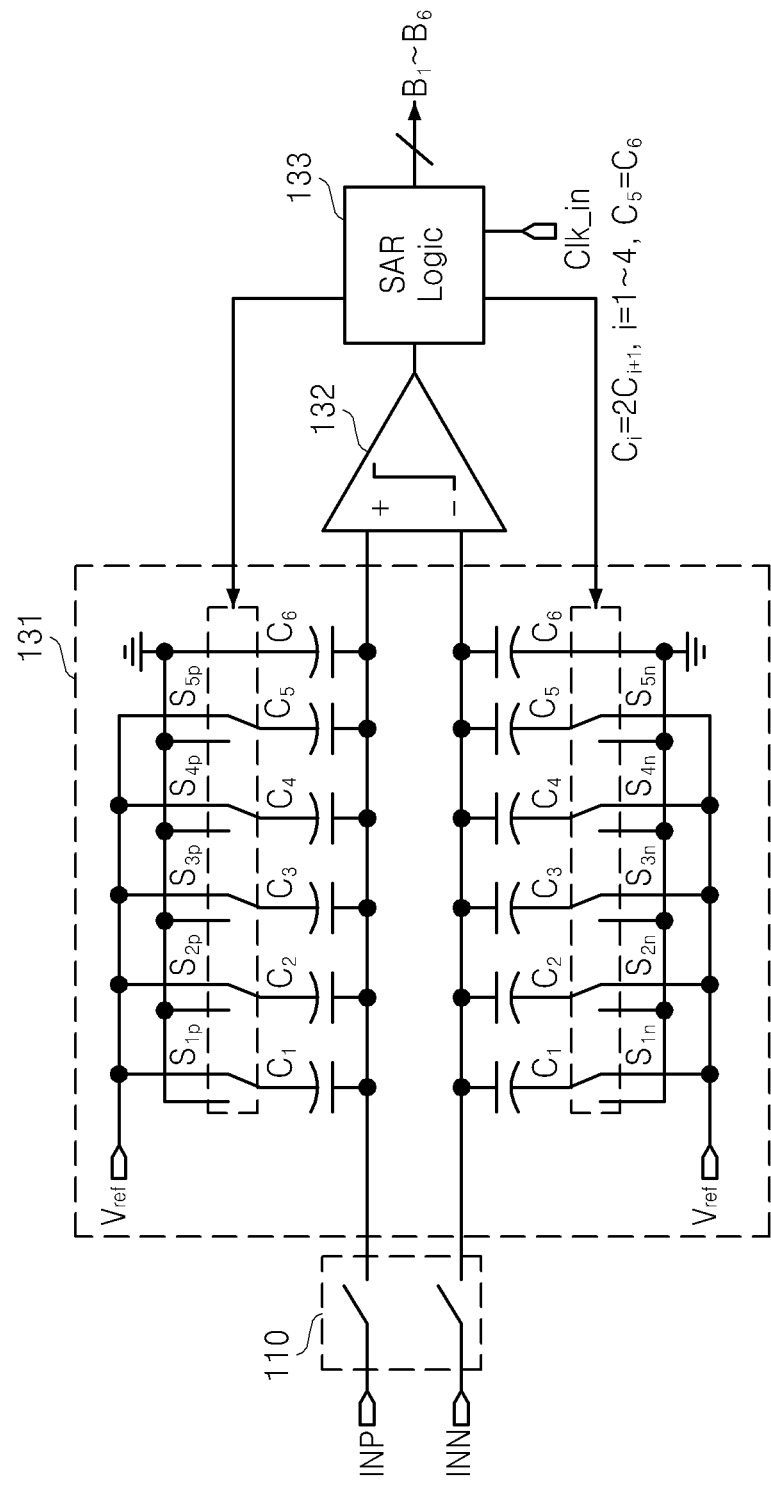
FIG. 2 is a schematic block diagram illustrating an operation of a third capacitor DAC.

FIG. 2 is a schematic block diagram illustrating an operation of the third CDAC $CDAC_3$ 131. In FIG. 2, an example of the CDAC for outputting the MSB and three less significant bits is illustrated for simplified description of the exemplary solution. In addition, it is assumed that two bits to which no threshold voltage modulation technology is applied are received from the double-bit output SAR analog-to-digital conversion unit (coarse 2b/cycle SAR ADC) 120. Referring to FIG. 2, the illustrated CDAC has a differential structure in which two capacitor arrays each including six capacitors $C_1$, $C_2$, $C_3$, $C_4$, $C_5$, and $C_6$ are arranged. In addition, the first and second analog signals INP and INN are directly applied to top plates of the capacitors $C_1$, $C_2$, $C_3$, $C_4$, $C_5$, and $C_6$ constituting the capacitor array and a common mode voltage $V_{cm}$ or a reference voltage $V_{ref}$ is applied to bottom plates of the capacitors $C_1$, $C_2$, $C_3$, $C_4$, $C_5$, and $C_6$. That is, the common mode voltage $V_{cm}$ is applied to the bottom plates of the capacitors $C_1$, $C_2$, $C_3$, $C_4$, $C_5$, and $C_6$ when the third CDAC $CDAC_3$ 131 is in the sampling section and the reference voltage $V_{ref}$ is applied to the bottom plates of the capacitors $C_1$, $C_2$, $C_3$, $C_4$, $C_5$, and $C_6$ when the third CDAC $CDAC_3$ 131 is in the comparison and settling section.

An operation of the CDAC having the above-described configuration is as follows. First, when the input signals INP and INN are transferred from the bootstrapping unit 110, the CDAC stores the input voltage in the capacitors $C_1$, $C_2$, $C_3$, $C_4$, $C_5$, and $C_6$ through the top plate sampling during one clock cycle. The comparator 132 compares magnitude relations of input signals sampled immediately after the sampling cycle ends, outputs the MSB, and stores the MSB in the SAR logic 133. When this process ends, a first operation of the CDAC ends. The first operation of the single-bit output SAR analog-to-digital conversion unit (fine 1b/cycle SAR ADC) 130 ends as described above. When the six bits output from the double-bit output SAR analog-to-digital conversion unit (coarse 2b/cycle SAR ADC) 120 receiving the MSB are received, a second operation of the single-bit output SAR analog-to-digital conversion unit (fine 1b/cycle SAR ADC) 130 is performed. The second operation will be briefly described with reference to FIG. 2. First, the CDAC determines values connected to $S_{1n}$ and $S_{1p}$ based on the MSB and determines values connected to $S_{2n}$, $S_{2p}/S_{3n}$, and $S_{3p}$ based on a value output from the double-bit output SAR analog-to-digital conversion unit (coarse 2b/cycle SAR ADC) 120. Thereafter, the less significant bits are generated by determining values to be connected to switches after $S_{3n}$ and $S_{3p}$ according to a scheme of the conventional SAR ADC.

Referring to FIG. 1 again, when a top-plate-sampled signal is generated from the third CDAC $CDAC_3$ 131 as described above, the SAR logic 133 derives the MSB from the top-plate-sampled signal through the fourth comparator 132 and outputs the MSB. This is to reduce the ½ clock cycle, and the double-bit output SAR analog-to-digital conversion unit (coarse 2b/cycle SAR ADC) 120 starts the operation in response to an MSB output signal of the top-plate-sampled signal.

When n/2 bits from the next more significant bit except the MSB (n denotes the resolution of the low-power, high-speed SAR ADC of the present solution) are transferred from the double-bit output SAR analog-to-digital conversion unit (coarse 2b/cycle SAR ADC) 120, the third CDAC CDAC₃ 131 performs an operation of outputting the remaining bits. At this time, the specific processing process follows the conventional general procedure. On the other hand, an example in which the number of bits output from the double-bit output SAR analog-to-digital conversion unit (coarse 2b/cycle SAR ADC) 120 is limited to n/2 is for description of the exemplary solution. The present invention is not limited thereto. For example, the number of bits to be output may change according to the resolution of the double-bit output SAR analog-to-digital conversion unit (coarse 2b/cycle SAR ADC) 120 and a circuit to be applied thereto.

A unit capacitor of the third CDAC CDAC3 131 may determine its capacitance based on noise performance of the third CDAC CDAC3 131. As illustrated in FIG. 2, when the third CDAC CDAC3 131 outputs a six-bit digital signal, the third CDAC CDAC3 131 may have six-bit kT/C noise performance according to the constraint of thermal noise. This indicates that the thermal noise of the third CDAC CDAC3 131 needs to be less than a sixth-bit voltage level.

Referring to FIGS. 1 and 2, the fourth comparator 132 connected to a stage subsequent to the third CDAC CDAC3 131 compares a positive capacitor array voltage and a negative capacitor array voltage of the third CDAC CDAC3 131. At this time, the fourth comparator 132 follows a low-noise design technique and is designed in consideration of 1/f noise and clock feedthrough. In other words, because the single-bit output SAR analog-to-digital conversion unit (fine 1b/cycle SAR ADC) 130 outputs a least significant bit (LSB), low-noise performance of the comparator is very important. For this, it is important to use a large-size MOSFET in a comparator circuit and to additionally attach a capacitor to a load of the comparator. At this time, the large-size MOSFET is used to reduce the 1/f noise of the MOSFET. Load capacitance is attached to reduce input-referred noise of noise occurring in all elements of the comparator.

The SAR logic 133 generates a digital code for the input voltage based on a comparison result of the fourth comparator 132 and controls the operation of the third CDAC CDAC3 131. In particular, the SAR logic 133 may settle the third CDAC CDAC3 131 based on output data of the double-bit output SAR analog-to-digital conversion unit (coarse 2b/cycle SAR ADC) 120 and output the remaining bits.

Figure 3:
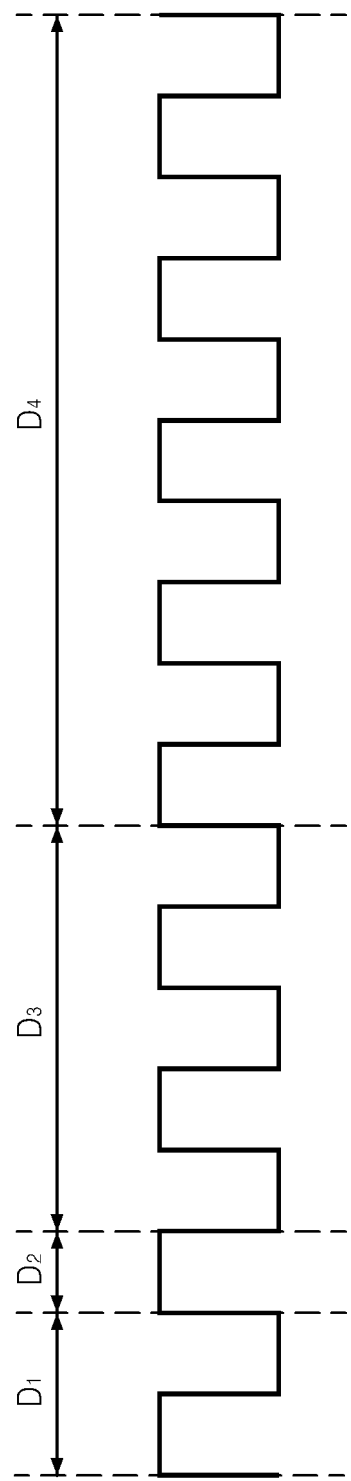
FIG. 3 is a diagram illustrating an operation of the low-power, high-speed SAR ADC.

FIG. 3 is a diagram illustrating an operation of the low-power, high-speed SAR ADC. Because the low-power, high-speed SAR ADC follows an asynchronous method, a high-speed external clock is not used. However, an operation of the low-power, high-speed SAR ADC will be described using a synchronous method in FIG. 3 to describe an increase in a sampling speed. In addition, an example in which the low-power, high-speed SAR ADC has the resolution of 12 bits will be described with reference to FIG. 3.

Referring to FIGS. 1 and 3, the low-power, high-speed SAR ADC 100 operates in all sections D1 to D4. When all cycles are completed, processes are continuously iterated.

First, in the section D1, the bootstrapping unit 110 is operated during one clock cycle. This is for enabling the CDACs CDAC1, CDAC2, and CDAC3 included in the double-bit output SAR analog-to-digital conversion unit (coarse 2b/cycle SAR ADC) 120 and the single-bit output SAR analog-to-digital conversion unit (fine 1b/cycle SAR ADC) 130 to sample input signals. That is, the third CDAC CDAC3 131 in which the fourth comparator 132 outputs the MSB from the top-plate-sampled signal without the settling process may generate the MSB for a half clock cycle and therefore may reduce a half clock cycle as compared with the convention technology in which one bit needs to be output in one clock cycle.

In the section D2, the SAR logic 133 of the single-bit output SAR analog-to-digital conversion unit (fine 1b/cycle SAR ADC) 130 outputs the MSB from the top-plate-sampled signal in the third CDAC CDAC3 131 during a half clock cycle. This is for reducing a ½ clock cycle in a total operation time by removing a ½ clock cycle necessary for settling in the third CDAC CDAC3 131.

In the section D3, the double-bit output SAR analog-to-digital conversion unit (coarse 2b/cycle SAR ADC) 120 operates. At this time, the double-bit output SAR analog-to-digital conversion unit (coarse 2b/cycle SAR ADC) 120 adopts a 2b/cycle structure and comparators for modulating the threshold voltage. Therefore, if six bits are desired to be output, one clock cycle is required when the first two bits are generated, one clock cycle is required when the next two bits are generated, a half clock cycle is required when the last two bits are generated. Accordingly, a total of 2.5 clock cycles is required. This is because, although a half clock cycle for settling of the first and second CDACs CDAC1 and CDAC2 121 and 122 and a half clock cycle for operations of the first to third comparators 123, 124, and 125 are required when the first two bits and the next two bits are generated, settling processes of the first and second CDACs CDAC1 and CDAC2 121 and 122 may be omitted by intentionally generating an offset in input parts of the first to third comparators 123, 124, and 125 when the last two bits are generated.

In the section D4, the single-bit output SAR analog-to-digital conversion unit (fine 1b/cycle SAR ADC) 130 operates. At this time, because the low-power, high-speed SAR ADC has the resolution of 12 bits, the single-bit output SAR analog-to-digital conversion unit (fine 1b/cycle SAR ADC) 130 needs to output six bits. Because one MSB is output in the section D2, only five bits need to be output in the section D4. For this, the single-bit output SAR analog-to-digital conversion unit (fine 1b/cycle SAR ADC) 130 receives 6-bit output data of the double-bit output SAR analog-to-digital conversion unit (coarse 2b/cycle SAR ADC) 120 and outputs the remaining five bits after the third CDAC CDAC3 131 are settled. In this section, an operation method of the conventional SAR ADC is performed.

In general, the conventional SAR ADC includes a sampling phase for outputting 12 bits and needs a total of 13 clock cycles. However, in the present solution, three clock cycles may be reduced using a combination of single-/double-bit output structures, a half clock cycle may be reduced using an MSB direct output technique to which top plate sampling is applied, and a half clock cycle may be reduced using comparator threshold voltage modulation technology. That is, as illustrated in FIG. 3, it can be seen that only nine clock cycles are required when the present invention is applied to output 12 bits.

Figure 4:
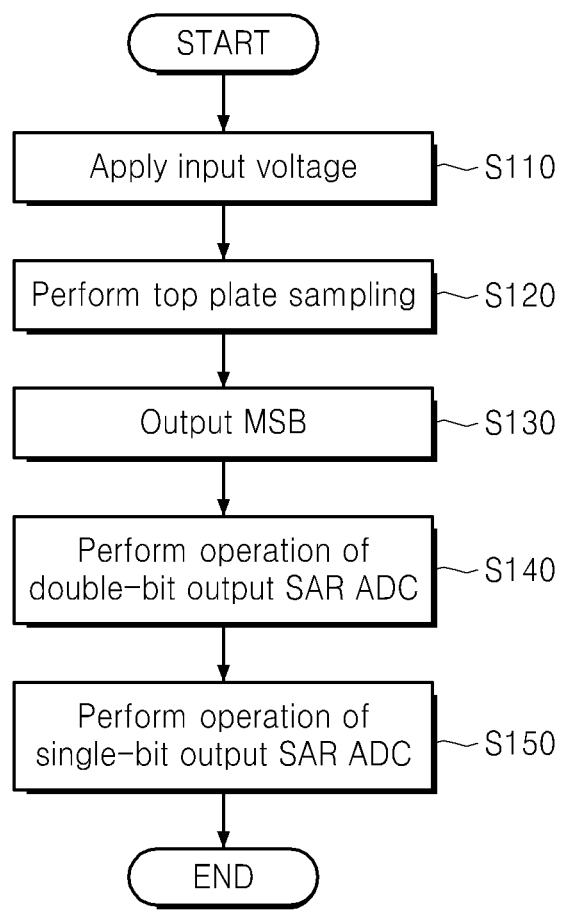
FIG. 4 is a processing flowchart illustrating an analog conversion process.

FIG. 4 is a processing flowchart illustrating an analog conversion process. Referring to FIGS. 1 and 4, an analog-to-digital conversion method using the low-power, high-speed SAR ADC 100 is as follows.

First, an input voltage is applied in step S110. That is, the first and second analog signals INP and INN are input to the bootstrapping unit 110. At this time, the first and second analog signals INP and INN are differential signals.

In step S120, the third CDAC CDAC3 131 of the single-bit output SAR analog-to-digital conversion unit (fine 1b/cycle SAR ADC) 130 performs top plate sampling in response to inputs of the first and second analog signals INP and INN.

In step S130, the SAR logic 133 of the single-bit output SAR analog-to-digital conversion unit (fine 1b/cycle SAR ADC) 130 outputs an MSB of a top-plate-sampled signal.

In step S140, the double-bit output SAR analog-to-digital conversion unit (coarse 2b/cycle SAR ADC) 120 operates in response to the MSB output in step S130. That is, the double-bit output SAR analog-to-digital conversion unit (coarse 2b/cycle SAR ADC) 120 outputs a two-bit digital signal for each clock cycle section. For this, a specific operation of the double-bit output SAR analog-to-digital conversion unit (coarse 2b/cycle SAR ADC) 120 is as described with reference to FIGS. 1 to 3.

In step S150, the single-bit output SAR analog-to-digital conversion unit (fine 1b/cycle SAR ADC) 130 operates. That is, one bit per clock cycle section is output in the digital signal for the first and second analog signals INN and INP in response to an output signal of the double-bit output SAR analog-to-digital conversion unit (coarse 2b/cycle SAR ADC) 120. For this, it is preferable that the single-bit output SAR analog-to-digital conversion unit (fine 1b/cycle SAR ADC) 130 output the remaining bits except the MSB output in step S130 after the third CDAC CDAC3 131 is settled based on data output from the double-bit output SAR analog-to-digital conversion unit (coarse 2b/cycle SAR ADC) 120. For this, a specific operation of the single-bit output SAR analog-to-digital conversion unit (fine 1b/cycle SAR ADC) 130 is as described with reference to FIGS. 1 to 3.

At this time, when the low-power, high-speed SAR ADC 100 has a resolution of 12 bits, each of the double-bit output SAR analog-to-digital conversion unit (coarse 2b/cycle SAR ADC) 120 and the single-bit output SAR analog-to-digital conversion unit (fine 1b/cycle SAR ADC) 130 outputs a six-bit digital signal.

In the above exemplary systems, although the methods have been described based on the flowchart using a series of the steps or blocks, the present invention is not limited to the sequence of the steps, and some of the steps may be performed in order different from that of the remaining steps or may be performed simultaneously with the remaining steps.

Furthermore, those skilled in the art will understand that the steps shown in the flowchart are not exclusive and they may include other steps or one or more steps of the flowchart may be deleted without affecting the scope of the present invention.

What is claimed is:

1. A low-power, high-speed successive approximation register (SAR) analog-to-digital converter (ADC) comprising:
   a bootstrapping unit configured to receive inputs of first and second analog signals;
   a double-bit output SAR analog-to-digital conversion unit configured to output a two-bit digital signal for each clock cycle section with respect to the first and second analog signals applied through the bootstrapping unit; and
   a single-bit output SAR analog-to-digital conversion unit configured to output a one-bit digital signal for each clock cycle section with respect to the first and second analog signals applied through the bootstrapping unit;
   wherein the bootstrapping unit includes first to third bootstrapping switch pairs,
   wherein the first and second bootstrapping switch pairs apply the first and second analog signals to the double-bit output SAR analog-to-digital conversion unit, and
   wherein the third bootstrapping switch pair applies the first and second analog signals to the single-bit output SAR analog-to-digital conversion unit.

2. The low-power, high-speed SAR ADC according to claim 1, wherein the first and second analog signals are differential signals.

3. The low-power, high-speed SAR ADC according to claim 1, wherein the double-bit output SAR analog-to-digital conversion unit includes:
   first and second capacitor digital-to-analog converters (DACs) implemented by a capacitor array of a differential structure including a plurality of capacitors and configured to output a voltage of a positive capacitor array and a voltage of a negative capacitor array;
   a first comparator configured to compare the voltage of the positive capacitor array and the voltage of the negative capacitor array of the first capacitor DAC;
   a second comparator configured to compare the voltage of the positive capacitor array of the first capacitor DAC with the voltage of the negative capacitor array of the second capacitor DAC;
   a third comparator configured to compare the voltage of the positive capacitor array and the voltage of the negative capacitor array of the second capacitor DAC; and
   a first SAR logic configured to generate a digital code for an input voltage based on comparison results of the first to third comparators and control operations of the first and second capacitor DACs.

4. The low-power, high-speed SAR ADC according to claim 3, wherein the first comparator is able to perform threshold voltage modulation.

5. The low-power, high-speed SAR ADC according to claim 3, wherein the second comparator is able to perform threshold voltage modulation.

6. The low-power, high-speed SAR ADC according to claim 3, wherein the third comparator is able to perform threshold voltage modulation.

7. The low-power, high-speed SAR ADC according to claim 1, wherein the single-bit output SAR analog-to-digital conversion unit includes:
   a third capacitor DAC implemented by a capacitor array of a differential structure including a plurality of capacitors and configured to output a voltage of a positive capacitor array and a voltage of a negative capacitor array;
   a fourth comparator configured to compare the voltage of the positive capacitor array and the voltage of the negative capacitor array of the third capacitor DAC; and
   a second SAR logic configured to generate a digital code for an input voltage based on a comparison result of the fourth comparator and control an operation of the third capacitor DAC.

8. The low-power, high-speed SAR ADC according to claim 7, wherein the third capacitor DAC has top plates of capacitors constituting the capacitor array to which the first and second analog signals applied through the bootstrapping unit are directly applied and bottom plates of the capacitors to which a reference voltage is applied and performs top plate sampling.

9. The low-power, high-speed SAR ADC according to claim 8, wherein the second SAR logic outputs a most significant bit (MSB) from a signal sampled by the top plate sampling through the fourth comparator.

10. The low-power, high-speed SAR ADC according to claim 9, wherein the double-bit output SAR analog-to-digital conversion unit starts an operation in response to an MSB output signal of the sampled signal.

11. The low-power, high-speed SAR ADC according to claim 7, wherein the second SAR logic settles the third capacitor DAC based on output data of the double-bit output SAR analog-to-digital conversion unit and outputs the remaining bits except an MSB and bits output by the double-bit SAR analog-to-digital conversion unit through the fourth comparator.

12. The low-power, high-speed SAR ADC according to claim 7, wherein the third capacitor DAC determines capacitance of a unit capacitor based on noise performance of the third capacitor DAC.

13. An analog-to-digital conversion method using a low-power, high-speed SAR ADC in which an SAR ADC configured to output a single bit and an SAR ADC configured to output two bits are combined, the analog-to-digital conversion method comprising:
    performing top plate sampling in response to inputs of first and second analog signals; outputting an MSB of a top-plate-sampled signal;
    performing double-bit output SAR analog-to-digital conversion for outputting a two-bit digital signal for each clock cycle section with respect to the first and second analog signals when the MSB of the top-plate-sampled signal is output; and
    performing single-bit output SAR analog-to-digital conversion for outputting a one-bit digital signal for each clock cycle section with respect to the first and second analog signals when a result of the double-bit output SAR analog-to-digital conversion is output.

14. The analog-to-digital conversion method according to claim 13, wherein the outputting of the MSB of the top-plate-sampled signal is performed by the SAR ADC configured to output the single bit.

15. The analog-to-digital conversion method according to claim 13, wherein the single-bit output SAR analog-to-digital conversion includes:
    settling a capacitor DAC for the single-bit output SAR analog-to-digital conversion based on data output in the double-bit output SAR analog-to-digital conversion; and
    outputting the remaining bits except the MSB output in the outputting of the MSB and bits output in the double-bit output SAR analog-to-digital conversion.

* * * * *